(12) United States Patent
Maruyama et al.

(10) Patent No.: US 10,153,708 B2
(45) Date of Patent: Dec. 11, 2018

(54) THREE-LEVEL POWER CONVERTER

(71) Applicant: FUJI ELECTRIC CO., LTD., Kawasaki-shi, Kanagawa (JP)

(72) Inventors: Koji Maruyama, Hachioji (JP); Takaaki Tanaka, Hachioji (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 107 days.

(21) Appl. No.: 15/230,968

(22) Filed: Aug. 8, 2016

(65) Prior Publication Data

US 2016/0344301 A1 Nov. 24, 2016

Related U.S. Application Data

(63) Continuation of application No. PCT/JP2015/061544, filed on Apr. 15, 2015.

(30) Foreign Application Priority Data

Aug. 26, 2014 (JP) .................................. 2014-171698

(51) Int. Cl.
*H02M 7/537* (2006.01)
*H02M 7/487* (2007.01)
(Continued)

(52) U.S. Cl.
CPC ........... *H02M 7/003* (2013.01); *H01L 25/115* (2013.01); *H01L 25/18* (2013.01); *H02M 7/48* (2013.01);
(Continued)

(58) Field of Classification Search
CPC ...... H02M 7/003; H02M 7/217; H02M 7/219; H02M 7/48; H02M 7/483; H02M 7/487;
(Continued)

(56) References Cited

U.S. PATENT DOCUMENTS

| | | | | | |
|---|---|---|---|---|---|
| 5,459,655 | A | * | 10/1995 | Mori | ....................... H01L 23/04 257/E23.14 |
| 5,731,970 | A | * | 3/1998 | Mori | ....................... H01L 23/04 257/E23.14 |

(Continued)

FOREIGN PATENT DOCUMENTS

| JP | H05-094854 A | 4/1993 |
|---|---|---|
| JP | H11-089247 A | 3/1999 |

(Continued)

OTHER PUBLICATIONS

PCT, "International Search Report for International Application No. PCT/JP2015/061544".

(Continued)

*Primary Examiner* — Timothy J Dole
*Assistant Examiner* — Ivan Laboy Andino
(74) *Attorney, Agent, or Firm* — Manabu Kanesaka

(57) ABSTRACT

A three-level power converter includes a first module housing a vertical arm forming a three-level power conversion circuit; a second module disposed adjacent to the first module and housing an intermediate arm forming the three-level power conversion circuit; high-potential and low-potential connecting terminal boards each extending vertically, and having a lower end connected to connecting terminals on an upper surface of the first module, and an upper end provided with an external connecting end; and a flat intermediate-potential connecting terminal board extending vertically, and having a lower end connected to connecting terminals on an upper surface of the second module, and an upper end provided with an external connecting end. The high-potential, low-potential, and intermediate-potential connecting terminal boards are stacked close to and parallel to one another. Each of the external connect- (Continued)

ing ends is connected to a corresponding terminal of a DC capacitor.

10 Claims, 12 Drawing Sheets

(51) Int. Cl.
| | |
|---|---|
| *H01L 25/18* | (2006.01) |
| *H01L 25/11* | (2006.01) |
| *H05K 5/02* | (2006.01) |
| *H02M 7/00* | (2006.01) |
| *H02M 7/48* | (2007.01) |
| *H02M 7/483* | (2007.01) |
| *H05K 5/00* | (2006.01) |

(52) U.S. Cl.
CPC ............ *H02M 7/483* (2013.01); *H02M 7/537* (2013.01); *H05K 5/0065* (2013.01); *H05K 5/0247* (2013.01); *H02M 7/487* (2013.01)

(58) Field of Classification Search
CPC ..... H02M 7/537; H02M 7/5387; H01L 25/04; H01L 25/07; H01L 25/115; H01L 25/18; H05K 5/0065; H05K 5/0247; H05K 1/0216
USPC ................................. 363/132, 144, 146, 147
See application file for complete search history.

(56) References Cited

U.S. PATENT DOCUMENTS

| | | | | |
|---|---|---|---|---|
| 6,028,779 | A * | 2/2000 | Sakamoto ............ | H02M 7/003 363/132 |
| 6,456,516 | B1 | 9/2002 | Bruckmann et al. | |
| 7,505,294 | B2 * | 3/2009 | Ahmed ................. | H02M 7/003 363/132 |
| 2009/0219696 | A1 * | 9/2009 | Nakayama ............ | H02M 7/003 361/709 |
| 2010/0039843 | A1 * | 2/2010 | Takizawa ............... | H02M 7/487 363/131 |
| 2010/0327837 | A1 * | 12/2010 | Tsugawa ................. | H02M 1/32 323/285 |
| 2011/0074489 | A1 * | 3/2011 | Viitanen ................. | H02M 1/08 327/427 |
| 2011/0242860 | A1 * | 10/2011 | Takizawa ............... | H01L 23/645 363/62 |
| 2011/0242866 | A1 * | 10/2011 | Takizawa ............... | H02M 7/487 363/131 |
| 2012/0001227 | A1 * | 1/2012 | Takahashi ............. | H02M 7/003 257/140 |
| 2012/0119256 | A1 * | 5/2012 | Okita ..................... | H01L 25/072 257/140 |
| 2012/0205983 | A1 | 8/2012 | Koyanagi et al. | |
| 2013/0063067 | A1 | 3/2013 | Tanaka | |
| 2014/0111959 | A1 * | 4/2014 | Li .......................... | H02M 7/003 361/809 |
| 2014/0218991 | A1 * | 8/2014 | Chen ..................... | H02M 7/537 363/131 |
| 2014/0254228 | A1 * | 9/2014 | Ying ..................... | H02M 7/5387 363/132 |
| 2014/0346659 | A1 * | 11/2014 | Nakamura ............. | H02M 7/003 257/704 |
| 2014/0361424 | A1 | 12/2014 | Horio et al. | |
| 2015/0109738 | A1 * | 4/2015 | Yamada ............... | H01L 23/4334 361/717 |
| 2015/0222201 | A1 * | 8/2015 | Nakashima ........... | H02M 7/487 363/131 |
| 2015/0270786 | A1 * | 9/2015 | Chen ..................... | H02M 7/537 363/131 |
| 2015/0340963 | A1 * | 11/2015 | Huang .................. | H02M 7/219 363/126 |
| 2016/0028224 | A1 * | 1/2016 | Yamada ................ | H02M 7/487 363/56.11 |
| 2016/0094153 | A1 * | 3/2016 | Li .......................... | H02M 7/797 363/123 |
| 2016/0192495 | A1 * | 6/2016 | Nakamura ........... | H01L 23/5227 361/783 |
| 2016/0295690 | A1 * | 10/2016 | Takano ................ | H05K 1/0296 |
| 2017/0214336 | A1 * | 7/2017 | Ogawa ................. | H02M 7/537 |

FOREIGN PATENT DOCUMENTS

| | | |
|---|---|---|
| JP | 2002-153078 A | 5/2002 |
| JP | 2004-236470 A | 8/2004 |
| JP | 2010-284079 A | 12/2010 |
| JP | 2010-288415 A | 12/2010 |
| JP | 2013-102627 A | 5/2013 |
| WO | 2011/061813 A1 | 5/2011 |
| WO | 2012/001805 A1 | 1/2012 |
| WO | 2013/145620 A1 | 10/2013 |

OTHER PUBLICATIONS

Europe Patent Office, "Search Report for European Patent Application No. 15836851.4," dated Sep. 14, 2017.

* cited by examiner

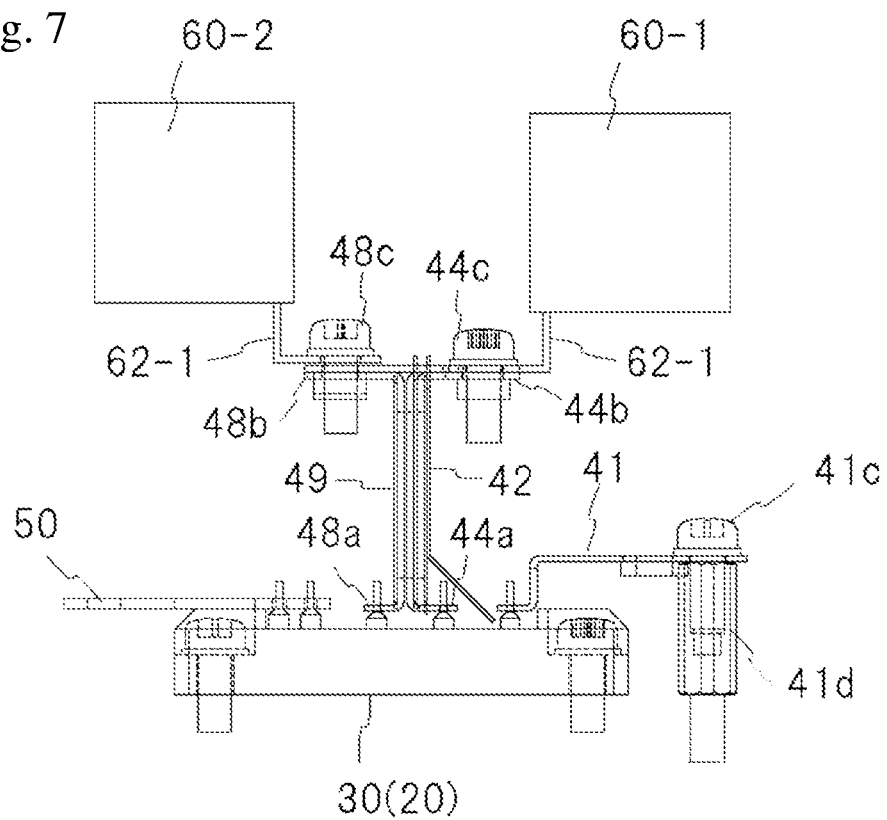

Prior Art

THREE-LEVEL POWER CONVERTER

CROSS-REFERENCE TO RELATED APPLICATION

This is a continuation application of PCT International Application No. PCT/JP2015/061544 filed on Apr. 15, 2015, which claims a priority of Japanese Patent Application No. 2014-171698 filed on Aug. 26, 2014.

TECHNICAL FIELD

The present invention relates to a three-level power converter that uses a semiconductor switch module, and more particularly to the wiring structures of a capacitor and a module.

BACKGROUND ART

A typical circuit of one phase of a three-level single-phase inverter or multi-phase inverter has the configuration shown in FIG. 11 of the present application. The inverter here means a circuit for converting a DC power into an AC power but also obviously converts an AC power into a DC power.

In FIG. 11, reference numeral 1 represents a DC power source, the voltage of which is divided by capacitors 2, 3 to form three potentials, P, M and N. Reference numerals 4 to 7 each represent a semiconductor switching element capable of intermittently controlling a forward current and constantly allowing passage of a reverse current. The semiconductor switching elements are each shown with a MOSFET (metal-oxide-semiconductor field-effect transistor) and a diode connected antiparallel thereto. The semiconductor switching elements 6 and 7 are connected in series in the directions opposite to each other and configured into a so-called bidirectional switch that is capable of intermittently controlling both forward and reverse currents. The semiconductor switching elements 4 and 5 are connected in series and configured into a vertical arm 11 corresponding to one phase. As opposed to the vertical arm 11, the bidirectional switch configured by connected the semiconductor switching elements 6 and 7 in series is called "intermediate arm 12."

In FIG. 11, the potential of an AC output terminal U is equivalent to the potential of a high-potential terminal P of the DC power source 1 when the semiconductor switching element 4 of the vertical arm 11 is on, and becomes equivalent to the potential of a lower-potential terminal N of the DC power source 1 when the semiconductor switching element 5 is on. When the semiconductor switching element 6 or 7 of the intermediate arm is on, the potential of the AC output terminal U becomes equivalent to the potential of an intermediate point M between the two capacitors 2 and 3, i.e., the intermediate potential of the DC power source 1.

In other words, the circuit shown in FIG. 11 forms a three-level inverter capable of selecting three voltage levels for the potential of the AC output terminal U in accordance with the ON state of each semiconductor switching element.

In such a three-level inverter circuit that generates outputs in three levels, a withstand voltage of each of the semiconductor switching elements 6 and 7 forming the intermediate arm 12 only needs to be half of that of each of the semiconductor elements 4 and 5 forming the vertical arm 11. In addition, depending on the operation conditions (power factor and modulation factor), conduction loss and switching loss that occur in each of the semiconductor switching elements forming the vertical arm and the intermediate arm vary. For this reason, the specifications of the semiconductor switching elements of the vertical arm and the intermediate arm that are suitable for the withstand voltages, switching characteristics and the like vary depending on the operational condition of a device to which this circuit is applied.

Furthermore, in a circuit that uses semiconductor switching elements, typically a surge voltage occurs due to the current changing rate (di/dt) obtained at the time of a switching operation and a parasitic inductance on the circuit. The surge voltage is a cause of overvoltage of a semiconductor switching element, which is often problematic. Since this problem similarly occurs in the three-level inverter circuit described above, parasitic inductances of DC circulating current paths need to be minimized.

In response to this need, PTL 1 discloses a technique for reducing wiring inductances by forming three connection conductors, i.e., a connection conductor connected to a high-potential point P, a connection conductor connected to an intermediate-potential point M, and a connection conductor connected to a low-potential point N, into flat conductors and arranging these flat conductors adjacent to each other with insulators therebetween, to form a laminated structure.

FIGS. 12(a) and 12(b) show the wiring structure described in PTL 1. FIGS. 12(a) and 12(b) show the wiring structure of a three-phase three-level inverter, wherein references Cd1 to Cd4 represent DC capacitors, reference numerals 18, 19 and 20 represent phase modules in which the semiconductor switching elements shown in FIG. 11 are stored, reference numeral 29 represents a flat P-potential connection conductor bar, reference numeral 30 represents a flat M-potential connection conductor bar, and reference numeral 31 represents a flat N-potential connection conductor bar. The DC capacitors Cd1 to Cd4 are disposed in a Y-direction shown in the diagram, which is the horizontal direction of the phase modules 18, 19 and 20. The flat connection conductor bars 29, 30 and 31 are configured into a connection conductor bar having a laminated structure, by stacking them with insulation sheets 32 and 33 therebetween. As is generally known, a connection conductor bar having a laminated structure can reduce parasitic inductances of the conductor parts by means of offsetting of the magnetic fluxes of the currents reciprocating in the conductors.

CITATION LIST

Patent Literature

[PTL 1] Japanese Patent Application Laid-open No. 2010-288415

SUMMARY OF INVENTION

Technical Problem

While a conventional technique aims to reduce the wiring parasitic inductances by forming a structure in which the connection conductor bars of the DC circulating current paths are arranged adjacent to each other as described above, PTL 1 is based on a configuration in which the semiconductor switching elements of the vertical arm and intermediate arm forming one phase of the three-level inverter are housed in a single package as a single module. Therefore, PTL 1 does not at all disclose a wiring structure in which a vertical arm and an intermediate arm are configured with separate modules which are then combined into a three-level inverter circuit.

In addition, there has recently been an emergence of a high-speed semiconductor switching element such as a SiC-MOSFET configured with a wide band-gap (WBG) semiconductor made from silicon carbide (SiC), gallium nitride (GaN)-based material, or diamond. A power converter that employs such a high-speed semiconductor switching element configured with a wide band-gap semiconductor causes switching operations at high speeds and higher frequencies. Therefore, wiring parasitic inductances need to be reduced even more.

As the same is true of inductances inside the modules that house the semiconductor switching elements and inductances between the terminals, the modules are made small, and the distance between terminals is made short.

Therefore, even when the wiring structure disclosed in PTL 1 or a wiring structure similar thereto is employed by a power converter that uses a high-speed semiconductor switching element configured with a wide band-gap semiconductor, the following problems arise:

1) The distance between a semiconductor switching element module and a DC capacitor cannot be reduced; and
2) In order to secure an insulation distance between the terminals, holes need to be punctured through wiring bars having different potentials to secure getaways, but when the bars are stacked horizontally in the modules where the terminals are close to each other, these getaways eliminate most of the overlapping part immediately above the modules, deteriorating the offsetting effect of the magnetic fluxes of the reciprocating currents.

For these reasons, it is difficult to further reduce wiring parasitic inductances of a power converter.

In order to solve these problems, the present invention aims to provide a wiring structure that not only forms a three-level power converter with a plurality of modules housing semiconductor switching elements, but also minimizes wiring inductances of DC circulating current paths of this power converter.

Solution to Problem

In order to achieve the foregoing object, the present invention is characterized in having:
- a first module that houses a vertical arm forming a three-level power conversion circuit;
- a second module that houses an intermediate arm forming the three-level power conversion circuit and is disposed adjacent to the first module;
- a flat high-potential connecting terminal board extending vertically and having a lower end connected to a connecting terminal on an upper surface of the first module and an upper end provided with an external connecting end;
- a flat low-potential connecting terminal board extending vertically and having a lower end connected to a connecting terminal on the upper surface of the first module and an upper end provided with an external connecting end; and
- a flat intermediate-potential connecting terminal board extending vertically and having a lower end connected to a connecting terminal on an upper surface of the second module and an upper end provided with an external connecting end.

The high-potential connecting terminal board, the low-potential connecting terminal board, and the intermediate-potential connecting terminal board are stacked close to and parallel to one another, and a terminal of a DC capacitor is connected to each of the external connecting ends of these connecting terminal boards.

In the present invention, it is preferred that terminal connectors connected to the connecting terminals on the upper surfaces of the modules and the external connecting ends are positioned diagonally to each other on the connecting terminal boards.

Furthermore, the connecting terminals on the upper surfaces of the first module and the second module are pin-shaped terminals and arranged identically on the upper surfaces of the modules. Each of the connecting terminals includes a pair of pin terminals.

Moreover, a plurality of module pairs each being formed of the first module and the second module can be arranged in such a manner that the first modules and the second modules are disposed adjacent to each other alternately, the high-potential connecting terminal board, the low-potential connecting terminal board, and the intermediate-potential connecting terminal board can be formed across the entire modules of the plurality of module pairs, and the plurality of module pairs can be connected in parallel by the high-potential connecting terminal board, the low-potential connecting terminal board, and the intermediate-potential connecting terminal board.

In addition, it is preferred that a semiconductor switching element included in the first module be formed from a wide band-gap semiconductor.

Advantageous Effects of Invention

According to the present invention, by forming separately the first module and the second module respectively housing a vertical arm and an intermediate arm forming a three-level inverter, optimum semiconductor switches can be applied to the modules in accordance with the specification of each device. In addition, due to the configuration in which the connecting terminal boards that extend from the respective modules are disposed close to and parallel to each other with insulating plates therebetween, wiring inductances of the DC circulating current paths of the three-level inverter can be minimized. In a case where the semiconductor switches are connected in parallel for the purpose of increasing the capacity of the device, the connecting terminal boards are simply extended commonly. Thus, not only is it possible to reduce the wiring inductances of the DC circulating current paths, but also the wiring inductances can be equalized, inhibiting imbalanced current allotment.

BRIEF DESCRIPTION OF DRAWINGS

FIG. 7 is a side view showing a configuration of the single-phase unit of the three-level inverter according to the first embodiment of the present invention.

DETAILED DESCRIPTION OF THE INVENTION

Embodiments of the present invention are described based on the examples shown in the diagrams.

First Embodiment

Figure 1:
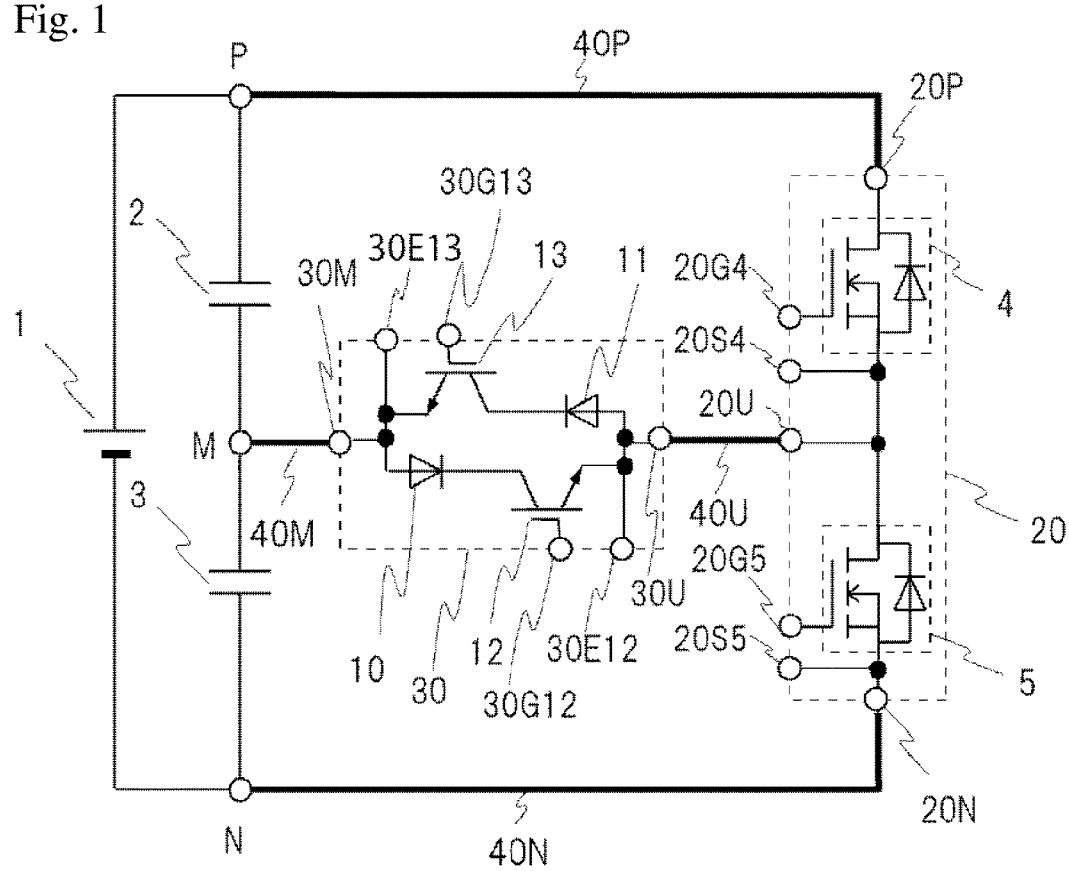
FIG. 1 is a circuit configuration diagram showing a single phase of a three-level inverter according to a first embodiment of the present invention.

FIG. 1 is a circuit configuration diagram showing a single phase of a three-level inverter according to a first embodiment of the present invention.

As shown in FIG. 1, a first module 20 houses a circuit that forms a vertical arm of a three-level inverter, in which semiconductor switches 4 and 5 configured with MOSFETs are connected in series. A bidirectional switch functioning as an intermediate arm of the three-level inverter is configured with diodes 10, 11 and IGBTs 12, 13, which are housed in a second module 30. The semiconductor switches applied to the vertical arm and the intermediate arm are not limited to the example shown in FIG. 1, and therefore various semiconductor switches such as high-speed switching elements made from wide band-gap semiconductor materials such as SiC (silicon carbide) can be used in accordance with the specifications of the devices used. Wide band-gap semiconductor materials have recently been put into practical use.

A high-potential connecting terminal 20P connected to a high-potential terminal P of a DC power source, a low-potential connecting terminal 20N connected to a low-potential terminal N, an output terminal 20U for extracting an AC output, and gate connecting terminals 20G4, 20G5 and auxiliary source terminals 20S4, 20S5 of the semiconductor switches 4, 5, extend from the module 20 forming the vertical arm.

An intermediate-potential connecting terminal 30M connected to an intermediate-potential terminal M of the DC power source, a connecting terminal 30U connected to the output terminal 20U of the vertical arm, and gate connecting terminals 30G12, 30G13 and auxiliary emitter terminals 30E12, 30E13 of the semiconductor switches 12, 13, extend from the module 30 forming the intermediate arm.

In the DC power source 1, a DC capacitor 2 is connected between the high-potential terminal P and the intermediate-potential terminal M of the DC power source 1, and a DC capacitor 3 is connected between the low-potential terminal N and the intermediate-potential terminal M of the same. The high-potential terminal P connected to the capacitor 2 and the high-potential connecting terminal 20P of the vertical arm module 20 are connected to each other by a high-potential connection conductor 40P. The low-potential terminal N connected to the capacitor 3 and the low-potential connecting terminal 20N of the vertical arm module 20 are connected to each other by a low-potential connection conductor 40N. The intermediate-potential connecting terminal 30M of the intermediate arm module 30 and the intermediate-potential terminal M are connected to each other by an intermediate-potential connection conductor 40M. The output terminal 20U of the vertical arm module 20 and the output terminal connecting terminal 30U of the intermediate arm 30 are connected to each other by an output connection conductor 40U. These connection conductors 40P, 40N, 40M, 40U each form a DC circulating current path of the inverter circuit.

Figure 2:
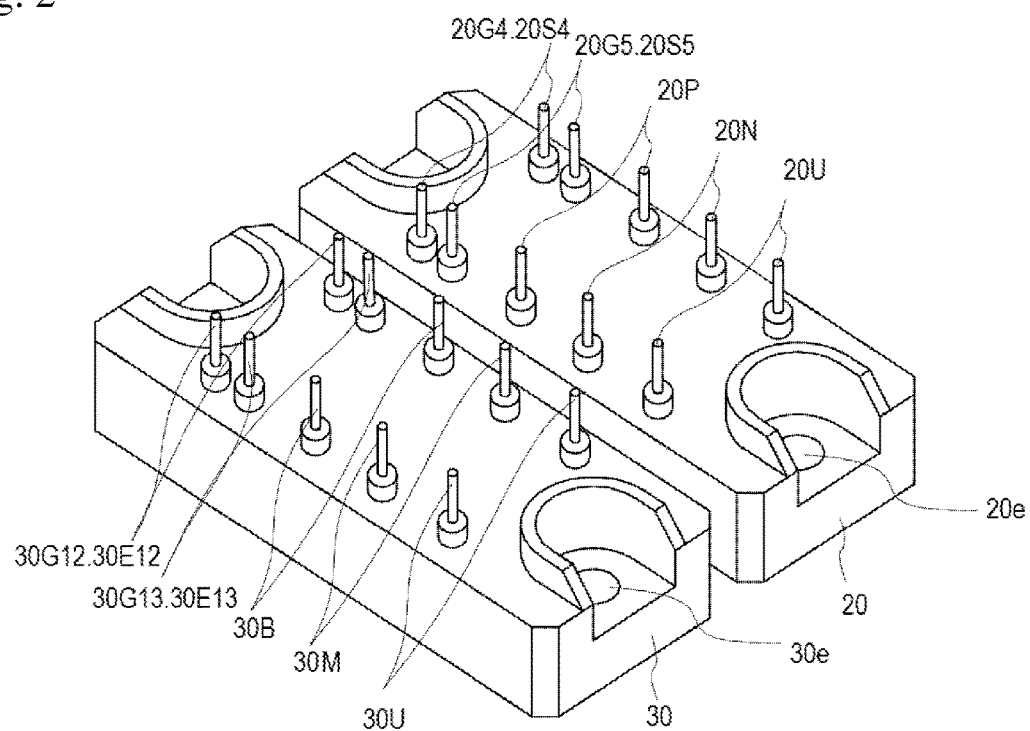
FIG. 2 is a perspective view showing an exterior of a first module that houses a vertical arm and a second module that houses an intermediate arm, the first and second modules being used in the present invention.

FIG. 2 shows the exterior of the module 20 and the module 30 that respectively form the vertical arm and the intermediate arm shown in FIG. 1. Each of these modules is packaged air-tightly with an insulating resin block that houses the semiconductor switching elements. A plurality of connecting terminals is arranged on an upper surface of the block, and either end of the block is provided with mounting holes 20e, 30e into which are inserted mounting screws for tightening and joining the modules to a heat dissipation substrate or the like.

Each of the connecting terminals provided in the modules 20 and 30 is configured by a pair of pin electrode. The pin electrodes are arranged identically between the modules.

The connecting terminals 20P, 20N and 20U of the vertical arm module 20 are the high-potential connecting terminal 20P, low-potential connecting terminal 20N, and output connecting terminal 20U of the vertical arm module 20 shown in FIG. 1. The connecting terminals 20G4 and 20G5 of the module 20 are the gate terminals of the semiconductor switches 4 and 5 of the vertical arm module 20 shown in FIG. 1, and the terminals 20S4 and 20S5 are the auxiliary source terminals.

The connecting terminals 30M and 30U of the intermediate arm module 30 are the intermediate-potential connecting terminal 30M and the output terminal 30U of the intermediate arm module 30 shown in FIG. 1. The connecting terminals 30G12 and 30G13 of the intermediate arm module 30 are the gate terminals of the semiconductor switches 12 and 13 of the intermediate arm module 30 shown in FIG. 1, and the terminals 30E12 and 30E13 are the auxiliary emitter terminals. A terminal 30B of the intermediate arm module 30 is a vacant terminal, which is not for electrical connection but is provided for the purpose of making the terminal arrangement in the intermediate arm module 30 identical with the terminal arrangement in the vertical arm module 20.

An assembly of the three-level inverter according to the present invention is described next with reference to FIG. 3 and FIG. 4.

Figure 3:
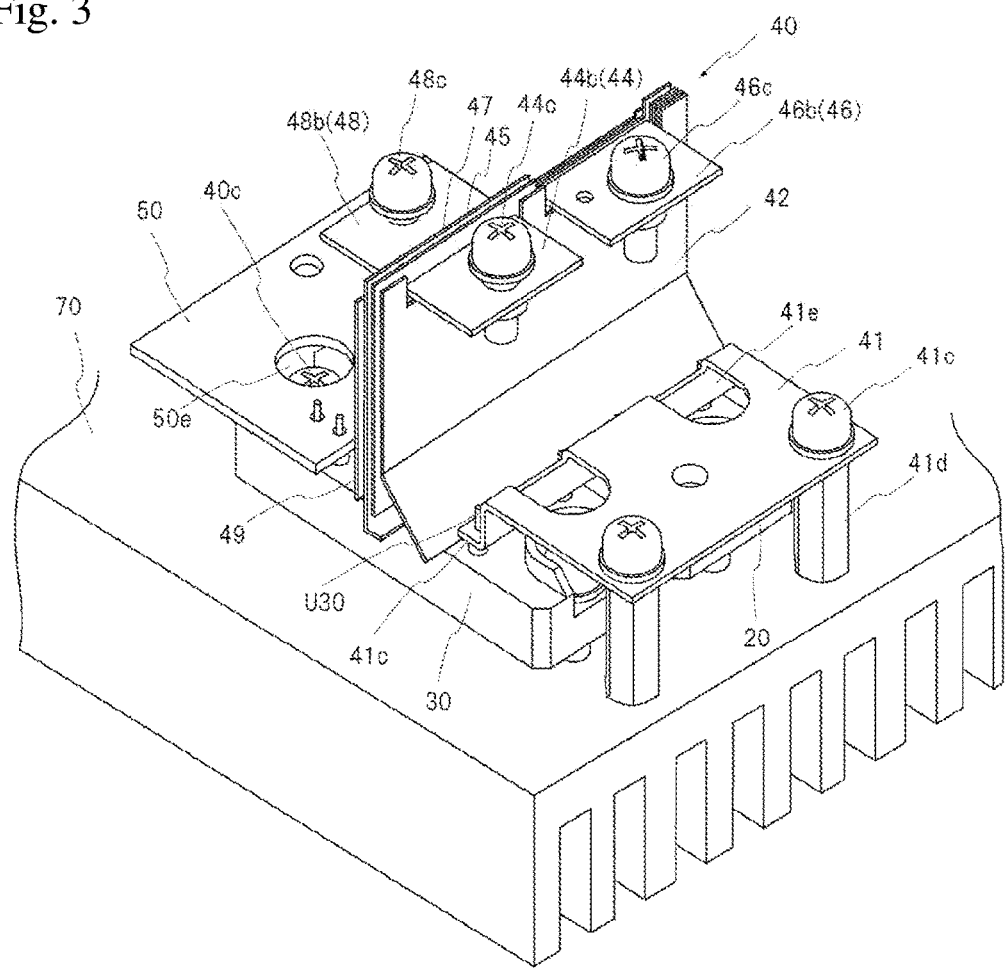
FIG. 3 is a perspective view showing an exterior of a module assembly of the three-level inverter according to a first embodiment of the present invention.

FIG. 3 is a configuration diagram of an assembly of a single-phase unit of the three-level inverter in which a connecting terminal board assembly 40 of the present invention is disposed on top of the two joined modules 20 and 30 shown in FIG. 2.

The modules 20 and 30 are disposed close to and parallel to each other on a cooling substrate 70 configured with a radiator, and secured to the cooling substrate 70 by mounting screws 40c. The connecting terminal board assembly 40 is fixedly disposed vertically across these two modules 20 and 30 that are disposed parallel to each other.

This connecting terminal board assembly 40 is configured by stacking a plurality of upright terminal boards and insulating plates. FIG. 4 shows an exploded view of the connecting terminal board assembly 40 as the detail thereof cannot be seen clearly in FIG. 3. The connecting terminal board assembly 40 is therefore described hereinafter with reference to FIG. 4.

An output terminal board 41 is a connecting terminal board forming the connection conductor 40U (FIG. 1) that connects the output terminals 20U and 30U of the two modules to each other, and is made from a flat conductive material. The output terminal board 40U has, on its left end side in FIG. 4, a connecting end 41a, the entire width of which is bent at a right angle. This connecting end 41a is provided with fitting holes 41e into which the pin-shaped connecting terminals 20U and 30U of the two modules are inserted and fitted. Fixing screws 41c for securing and supporting the terminal board 41 onto the cooling substrate 70 are joined respectively to spacers 41d made of an insulating material at the right end side of the terminal board 41. The terminal board 41 also has screw insertion holes 41f through which mounting screws are inserted, and these insertion holes 41f are positioned to face the mounting holes 20e, 30e of the modules when the terminal board 41 is joined to the modules 20 and 30.

Connecting terminal boards 44 and 48 are terminal boards forming vertically the low-potential connection conductor 40N and the high-potential connection conductor 40P shown in FIG. 1, and are each made from a flat conductive material. The connecting terminal boards 44 and 48 have, on their lower ends on the tip side (the module 20 side) in FIG. 4, terminal connectors 44a and 48a that are connected to the connecting terminals 20N and 20P of the module 20, and bent at right angles. In addition, external connecting ends 44b and 48b for external connection that are configured with screw terminals are bent at right angles and provided at the upper ends of the connecting terminal boards 44 and 48, at the near side (the module 30 side), so as to be diagonal to the terminal connectors 44a and 48a. The external connecting ends 44b and 48b protrude in the directions opposite to each other. The terminal connectors 44a and 48a are provided with fitting holes 44e and 48e into which the pin-shaped connecting terminals 20N and 20P of the module 20 are inserted and fitted.

A connecting terminal board 46 is a terminal board forming the intermediate-potential connection conductor 40M shown in FIG. 1, and is formed from a flat conductive material. The connecting terminal board 46 has, on its lower end at the tip side (the module 30 side), a terminal connector 46a that is bent at a right angle and connected to the connecting terminal 30M of the module 30. An external connecting end 46b for external connection that is configured with a screw terminal is bent at a right angle and provided at the upper end of the connecting terminal board 46, at the far side (the module 20 side), so as to be diagonal to the terminal connector 46a. This connecting terminal board 46 is accompanied by an auxiliary terminal board 46s that is joined to the external connecting end 46b to cause it to protrude to the right and left.

The insulating plates 42 and 43 are inserted between the output terminal board 41 and the low-potential connecting terminal board 44. The lower end of the outermost insulating plate 42 is bent outward in order to expand the insulation creepage distance, and the upper end of the same has a depressed portion 42g that allows the passage of the external connecting end 44b of the connecting terminal board 44 and a depressed portion 42h that allows the passage of the external connecting end 46b and auxiliary terminal board 46s of the connecting terminal board 46.

An insulating plate 45 is inserted between the connecting terminal boards 44 and 46 and has, at its upper end on the tip side, a depressed portion 45g that allows the passage of the auxiliary terminal board 46s of the connecting terminal board 46.

An insulating plate 47 is inserted between the connecting terminal boards 46 and 48 and has, at its upper end on the far side (the module 20 side), a depressed portion 47g that allows the passage of the auxiliary terminal board 46s of the connecting terminal board 46.

An insulating plate 49 is inserted between the connecting terminal board 48 and a gate circuit board 50 disposed on the outside of the connecting terminal board 48.

The gate circuit board 50 is configured with, although not shown, a printed circuit board having gate drive circuits of the semiconductor switches of the respective modules. The gate circuit board 50 has gate terminal connection holes 50e that are connected to the gate connecting terminals 20G and 30G, auxiliary source terminals 20S, and auxiliary emitter terminals 30E of the modules 20 and 30. The gate circuit board 50 also has screw insertion holes 50f through which the mounting screws 40c are inserted. The screw insertion holes 50f are positioned to face the mounting holes 20e and 30e of the modules when joined to the modules 20 and 30.

Figure 4:
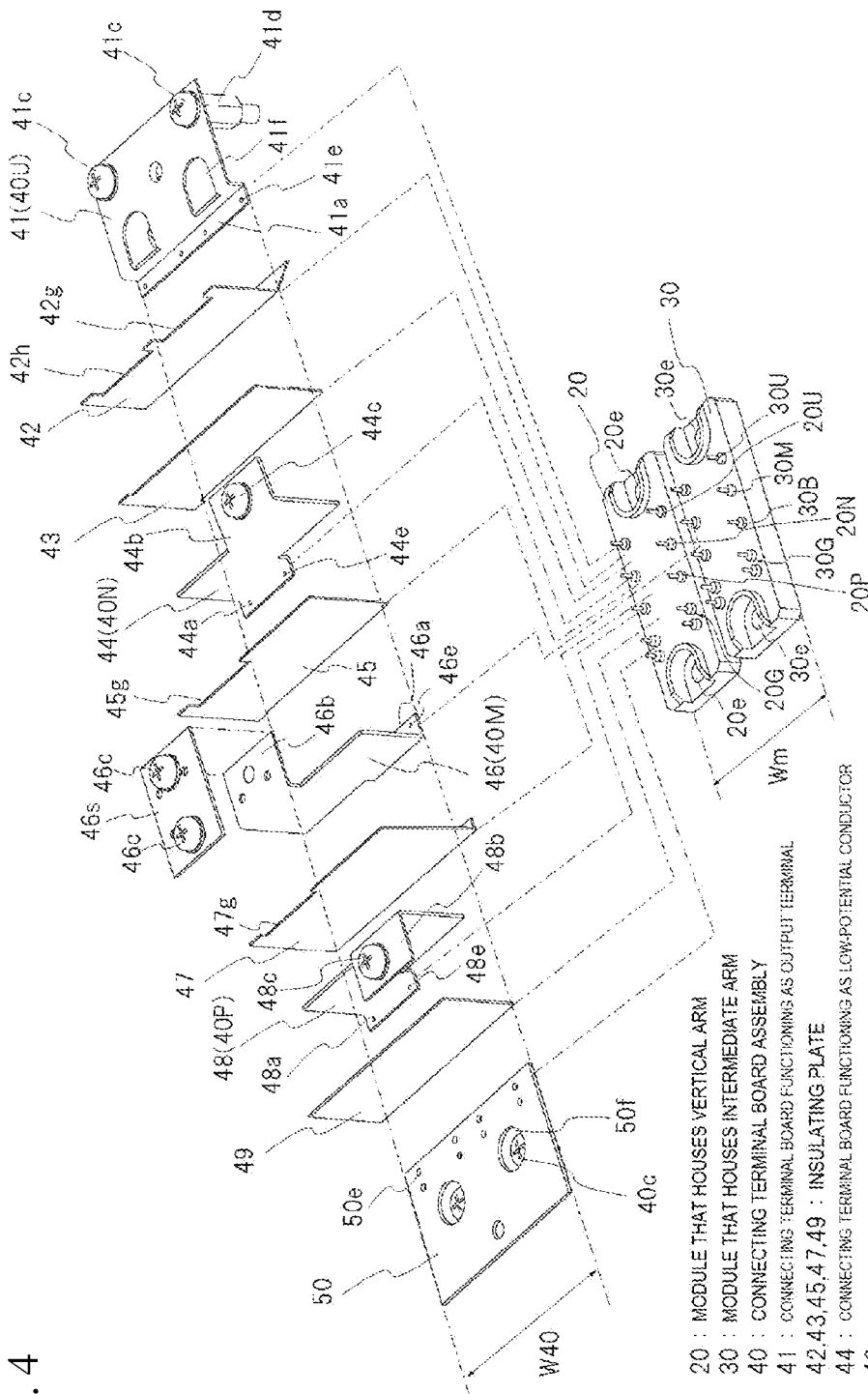
FIG. 4 is an exploded perspective view of the module assembly shown in FIG. 3, according to the first embodiment of the present invention.

Because all of these connecting terminal boards and insulating plates are disposed across the entire width Wm of the two modules 20 and 30 that are arranged close to and parallel to each other, as shown in FIG. 4, the width W40 is substantially equal to the entire width Wm of the modules. However, in view of the functions of the insulating plates, it is preferred that the width W40 be slightly greater than the entire width Wm so that the insulating plates protrude slightly from the edges of the modules.

A process for assembling the three-level inverter having the vertical arm module 20, the intermediate arm module 30, the connecting terminal board assembly 40, and the gate circuit board 50 is described hereinafter with reference to FIGS. 5(a)-5(k).

Figure 5A:
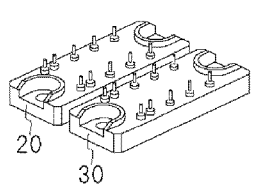
FIGS. 5(a)-5(k) are a process drawing that shows a process for assembling the module assembly according to the first embodiment of the present invention.

First, as shown in FIG. 5(a), the module 20 and the module 30 that respectively house the vertical arm and the intermediate arm forming the three-level inverter, are disposed close to and parallel to each other, with the gate terminals 20G and 30G positioned to the left. In so doing, the left front ends and the right rear ends of the modules are aligned so that the connecting terminals in each line on the modules are arranged in the same lines.

Figure 5B:
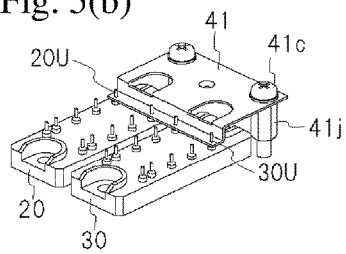

Next, as shown in FIG. 5(b), the output connecting terminal board 41 is placed horizontally on the right rear ends of the modules 20 and 30, and then the output connecting terminals 20U and 30U of the modules are inserted through and fitted into the fitting holes 41e. The connecting terminals 20U and 30U that are inserted into the fitting holes 41e are welded, brazed, or crimped (crushed) to electrically and mechanically join the connecting terminals 20U and 30U to the connecting terminal board 41, thereby securing the connecting terminal board 41.

Figure 5C:
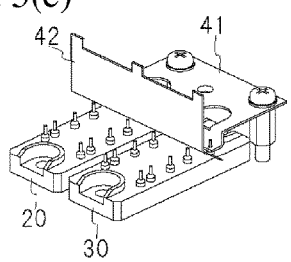
Figure 5D:
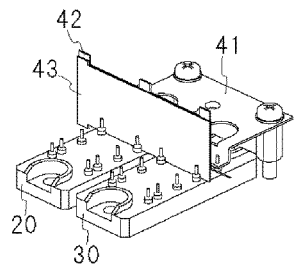

After securing the connecting terminal board 41 onto the modules 20 and 30, the insulating plates 42 and 43 are sequentially disposed vertically in front of the connecting terminal board 41, as shown in FIGS. 5(c) and 5(d).

Figure 5E:
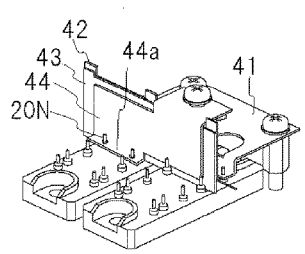

Next, the low-potential connecting terminal board 44 is disposed vertically in front of the insulating plate 43, as shown in FIG. 5(e). In so doing, the connecting terminal 20N of the module 20 is inserted and fitted into a fitting hole 44e of the terminal connector 44a of the terminal board 44 to electrically and mechanically join the connecting terminal board 44 and the connecting terminal 20N to each other by appropriate means, thereby securing the connecting terminal board 44.

Figure 5F:
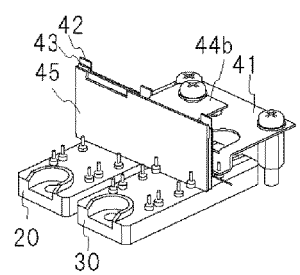

Subsequently, the insulating plate 45 is disposed vertically in front of the connecting terminal board 44, as shown in FIG. 5(f).

Figure 5G:
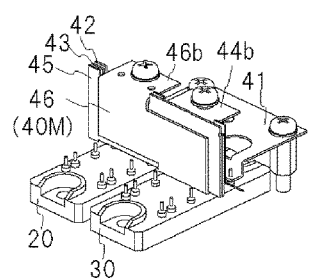

Then, the intermediate-potential connecting terminal board 46 is disposed vertically in front of the insulating plate 45, as shown in FIG. 5(g). Although not shown, the intermediate-potential connecting terminal 30M of the module 30 is inserted and fitted into fitting holes 46e of the connecting end 46a of the connecting terminal board 46. The connecting terminal board 46 and the connecting terminal 30M are thereby joined to each other electrically and mechanically by appropriate means, thereby securing the connecting terminal board 46. The external connecting end 46b at the upper end of the connecting terminal board 46 protrudes to the right through the depressed portions of the insulating plates.

Figure 5H:
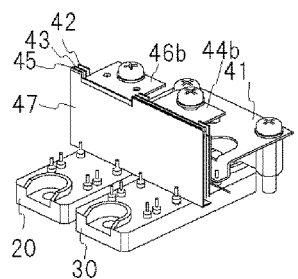
Figure 5I:
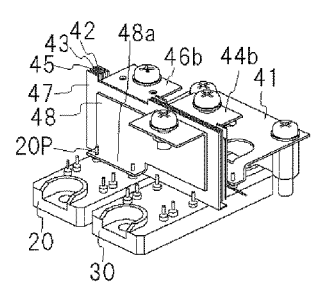

Next, the insulating plate 47 is disposed vertically in front of the connecting terminal board 46, as shown in FIG. 5(h). Subsequently, the high-potential connecting terminal board 48 is disposed vertically as shown in FIG. 5(i). The high-potential connecting terminal 20P of the module 20 is inserted and fitted into the fitting holes 48e of the connecting end 48a located at the lower end of the connecting terminal board 48, to electrically and mechanically join the connecting terminal board 48 and the connecting terminal to each other, thereby securing the connecting terminal board 48.

Figure 5J:
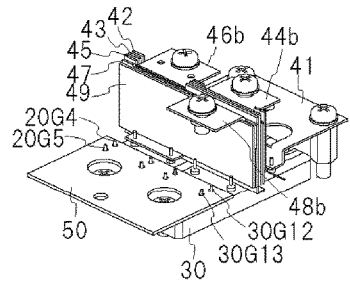
Figure 5K:
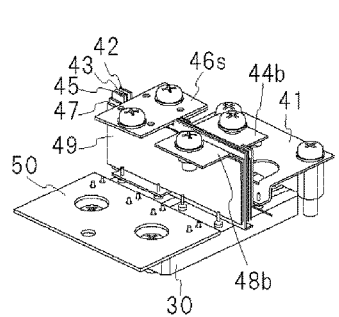

Next, the insulating plate 49 and the gate circuit board are disposed vertically and horizontally, respectively, in front of the connecting terminal board 48, as shown in FIG. 5(j). The gate connecting terminals 20G4, 20G5 and auxiliary source terminals 20S4, 20S5 of the module 20 and the gate connecting terminals 30G12, 30G13 and auxiliary emitter terminals 30E12, 30E13 of the module 30 are inserted and fitted into the gate terminal connecting hole 50e of the gate circuit board 50. Accordingly, the gate circuit board 50 is electrically and mechanically joined and secured to the gate terminals, the auxiliary source terminals, and the auxiliary emitter terminals.

Furthermore, the auxiliary terminal board 46s is placed on the external connecting end 46b of the intermediate-potential connecting terminal board 46 to electrically and mechanically join them together in such a manner that the external connecting end 46b projects to the right and left.

As a result, the module assembly in which the modules and the group of connecting terminals are joined is completed. Thereafter, DC capacitors for dividing a DC voltage to form a three-level (high potential, intermediate potential, low potential) DC voltage are connected between the external connecting end 44b and the auxiliary terminal board 46s and between the external connecting end 48b and the auxiliary terminal board 46s in the module assembly, completing a single-phase unit of the three-level inverter.

Figure 6A:
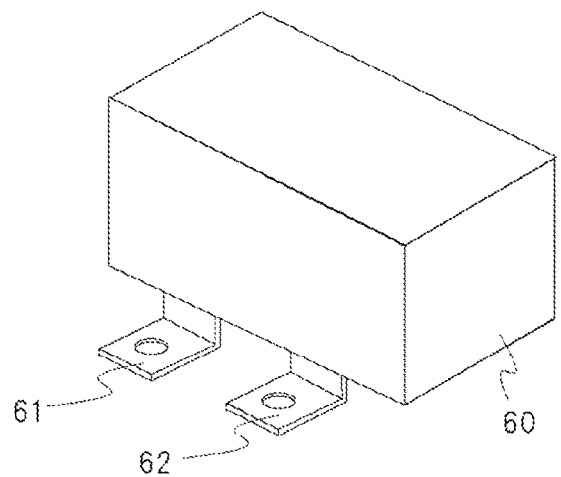
FIG. 6(a) is a perspective view showing an exterior of a capacitor according to the first example of the present invention.
Figure 6B:
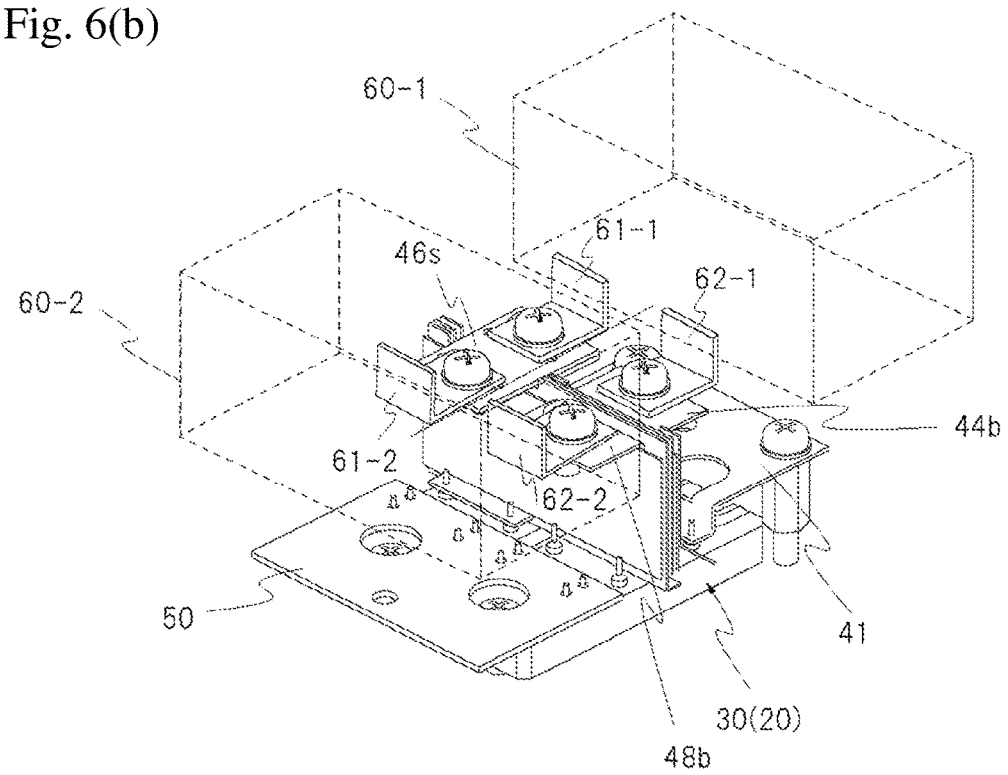
FIG. 6(b) is a perspective view showing an exterior of a single-phase unit of the three-level inverter according to the first embodiment of the present invention.

FIGS. 6(a) and 6(b) show the exterior of this completed single-phase unit of the three-level inverter, and FIG. 7 is a side view showing the same. FIG. 6(a) shows a DC capacitor 60. The DC capacitor 60 is provided with two connecting terminals 61 and 62, which are connected to the external connecting end 44b and the auxiliary terminal board 46.

FIG. 6(b) and FIG. 7 each show a configuration of the single-phase unit of the three-level inverter in which two DC capacitors 60-1 and 60-2 are joined to the module assembly. In FIG. 6(b), the capacitors 60-1 and 60-2 are shown transparently in order to clearly illustrate the connection states of the external connecting ends (44b, 46s, 48b) of the module assembly and terminals (61-1, 62-1, 61-2, 62-2) of the capacitors.

The capacitors 60-1 and 60-2 are each joined between the external connecting end 48b of the high-potential connecting terminal board 48 of the module assembly and the auxiliary terminal board 46s joined to the external connecting end 46b of the intermediate-potential connecting terminal board 46 and between the external connecting end 44b of the low-potential connecting terminal board 44 and the auxiliary terminal board 46s joined to the external connecting end 46b of the intermediate-potential connecting terminal board 46. Thus, the single-phase unit of the three-level inverter with the circuit configuration shown in FIG. 1 is configured.

In this configuration, the high-potential connecting terminal board 48, intermediate-potential connecting terminal board 46, and low-potential connecting terminal board 44 that configure the DC circulating current paths are stacked close to and parallel to each other. Due to such a configuration, the magnetic fluxes of the currents flowing oppositely in these conductors offset each other, resulting in a reduction in wiring inductances of the DC circulating current paths of the single-phase unit of the three-level inverter.

In addition, according to the present invention, a wiring inductance of each connecting terminal board can be further reduced because the terminal connectors (44a, 46a, 48a) that connect the connecting terminal boards (44, 46, 48) to the connecting terminals of the modules, and the external connecting ends (44b, 46b, 48b) are positioned diagonally to each other on the upper and lower sides of the terminal boards, respectively.

This point is now described with reference to FIGS. 8(a) and 8(b).

Figure 8A:
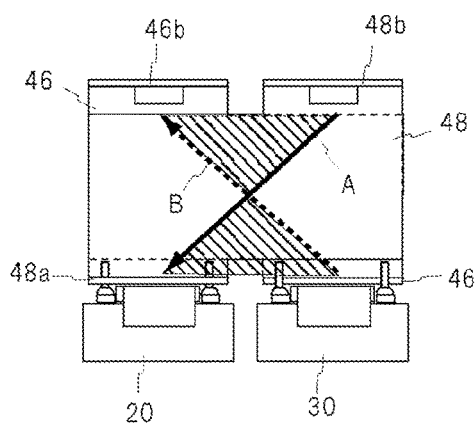
FIGS. 8(a) and 8(b) are a diagram showing flows of currents to explain the operations of the present invention.
Figure 8B:
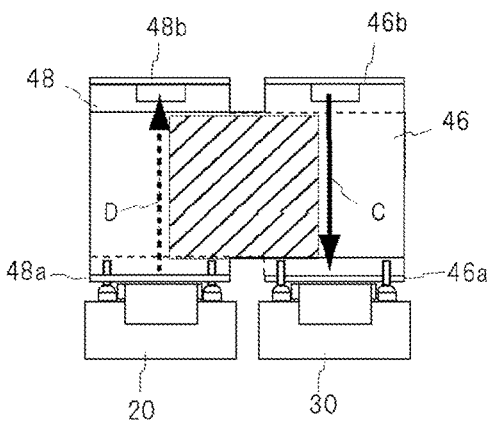

FIG. 8(a) is a diagram showing a flow of a current in each of the connecting terminal boards according to the present invention, which are provided with the connecting ends positioned diagonally to each other on the upper and lower sides of the connecting terminal boards, respectively. In comparison with the present invention, FIG. 8(b) is a diagram showing a flow of a current in each of the connecting terminal boards that are provided with the connecting ends positioned face-to-face at the upper and lower sides of the connecting terminal boards.

According to the present invention, the terminal connector 48a, which is provided at the lower end of the high-potential connecting terminal board 48 and connected to the connecting terminal of the module, is provided on the left-hand side so as to be positioned immediately above the module 20, while the external connecting end 48b on the upper end is provided on the right-hand side so as to be positioned immediately above the module 30, as shown in FIG. 8(a). Therefore, the terminal connector 48a and external connecting end 48b of the connecting terminal board 48 are positioned diagonally to each other on the upper and lower sides of the connecting terminal board 48, respectively. Due to such a configuration, a current flows obliquely from the external connecting end 48b to the terminal connector 48a in the connecting terminal board 48, as shown by the solid arrow A.

On the connecting terminal board 46, which is the intermediate-potential connection conductor disposed to face the connecting terminal board 48, the terminal connector 46a on the lower end is provided on the right-hand side so as to be positioned immediately above the module 30, while the external connecting end 46b on the upper end is provided at the left end so as to be positioned immediately above the module 20. Due to such a configuration, the terminal connector 46a and the external connecting end 46b, too, are positioned diagonally to each other on the upper and lower sides of the connecting terminal board 46, respectively. As a result, in the connecting terminal board 46, a current flows from the terminal connector 46a to the external connecting end 46b in the inclination direction opposite to the arrow A, as shown by the dotted arrow B.

Because the current shown by the arrow A and the current shown by the arrow B in the connecting terminal boards 48 and 46 intersect with each other, the areas of the sections surrounded by these currents form two hatched triangles and therefore are small.

However, in a case where the terminal connectors 46a, 48a and the external connecting ends 46b, 48b are provided at the lower and upper ends of the connecting terminal boards 46, 48 respectively so as to be positioned face-to-face, currents that are vertically parallel to each other flow in these connecting terminal boards, as shown by the arrows C and D. Therefore, the areas of the sections surrounded by the currents C and D form a hatched square, which is greater than that obtained in the present invention.

According to the present invention, such a difference in how the currents flow can be taken advantage of to reduce the wiring inductances of the DC circulating current paths.

Second Embodiment

Figure 9:
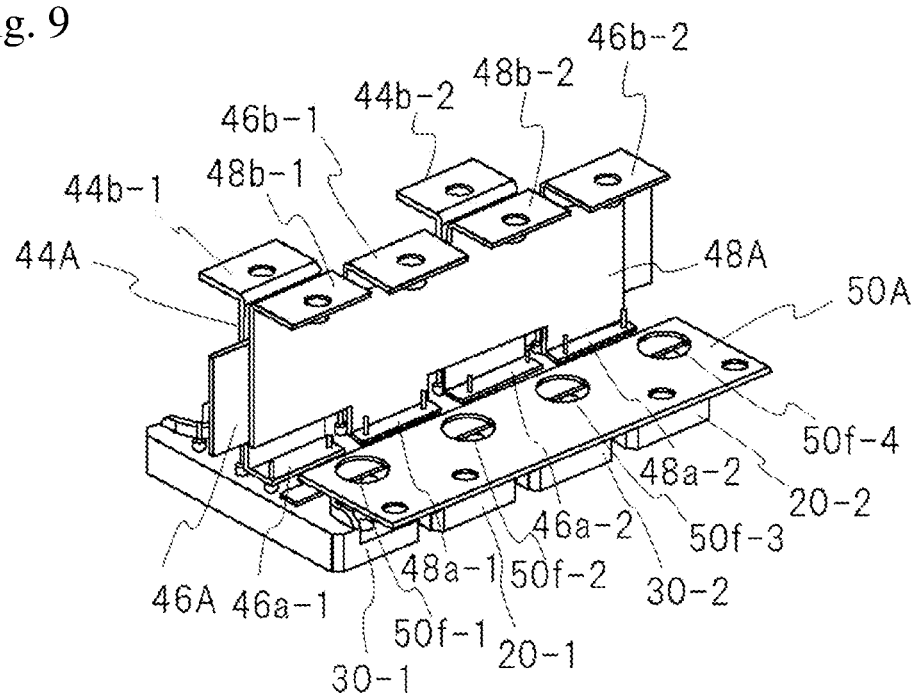
FIG. 9 is a perspective view showing an exterior of an assembly of two pairs of parallel modules according to a second embodiment of the present invention.

FIG. 9 shows a second embodiment of the present invention. In this example, the module 20 housing the vertical arm and the module 30 housing the intermediate arm are connected in two pairs and in parallel. FIG. 9 shows a simplified configuration of a connecting terminal board assembly without the insulating plates of the foregoing connecting terminal board assembly.

As shown in FIG. 9, two modules 20-1, 20-2 each housing a vertical arm and two modules 30-1, 30-2 each housing an intermediate arm are arranged alternately and in parallel.

These two pairs of modules that are disposed in parallel are provided with the connecting terminal boards 44A, 46A and 48A and the gate circuit board 50A, which are disposed across these two pairs of modules 20-1, 20-2 and 30-1, 30-2.

The high-potential connecting terminal board 48A is provided with two terminal connectors (48a-1, 48a-2) connected to the connecting terminals of the modules 20-1 and 20-2 each housing a vertical arm, and two external connecting ends (48b-1, 48b-2) that are connected to the capacitors and the like.

The low-potential connecting terminal board 44A is provided with two terminal connectors (not shown) that are connected to the connecting terminals of the modules 20-1 and 20-2 each housing a vertical arm, and two external connecting ends (44b-1, 44b-2) that are connected to the capacitors and the like.

The intermediate-potential connecting terminal board 46A is provided with two terminal connectors (46a-1, 46a-2) that are connected to the connecting terminals of the modules 30-1 and 30-2 each housing an intermediate arm, and two external connecting ends (46b-1, 46b-2) that are connected to the capacitors and the like.

The capacitors are not shown in the diagram but are connected between the external connecting ends 48b-1 and 46b-1 at the upper portion of the connecting terminal boards, between the external connecting ends 44b-1 and 46b-1, between the external connecting ends 48b-2 and 46b-2, and between the external connecting ends 44b-2 and 46b-2, and disposed in the upper portions of the modules.

The terminal connectors and the external connecting ends of the respective connecting terminal boards are located diagonally to each other in the respective pairs of modules. For instance, in the connecting terminal board 48A, the terminal connector 48a-1 is positioned immediately above the module 20-1, and the external connecting end 48b-1 is positioned immediately above the module 30-1 paired with the module 20-1. Another terminal connector 48a-2 is positioned immediately above the module 20-2, and the external connecting end 48b-2 is positioned immediately above the module 30-2 paired with the module 20-2.

Therefore, in the second embodiment as well, the magnetic fluxes of the currents flowing oppositely between these connecting terminal boards offset each other, resulting in a reduction in wiring inductances of the connecting terminal boards. Positioning the terminal connectors and external connecting ends of the connecting terminal boards diagonally to each other in the terminal boards can further reduce the wiring inductances of the connecting terminal boards as with the first embodiment.

Third Embodiment

Figure 10:
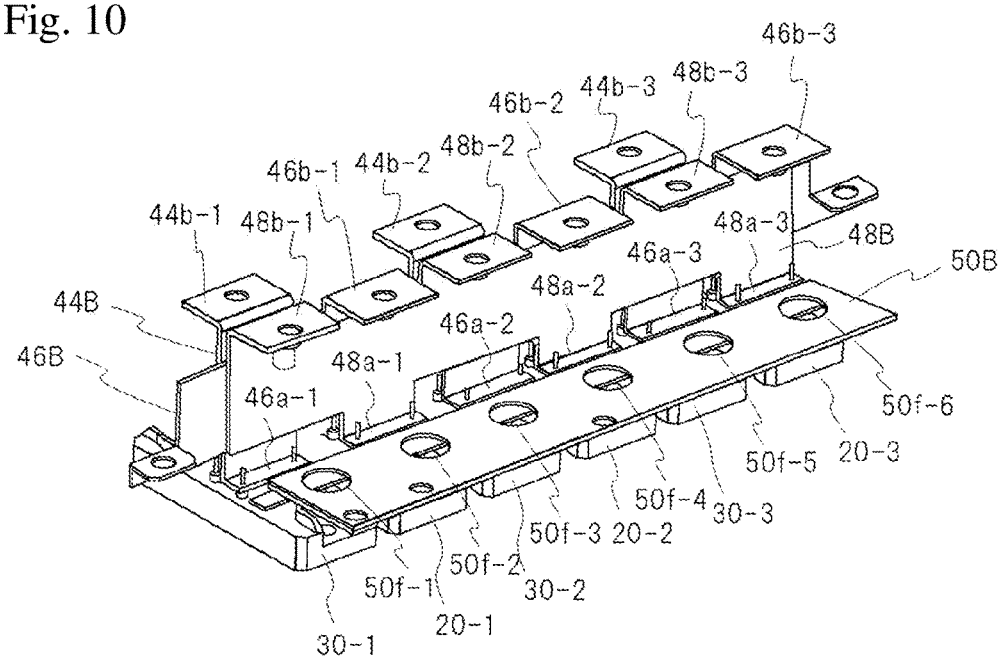
FIG. 10 is a perspective view showing an exterior of an assembly of three pairs of parallel modules according to a third embodiment of the present invention.
Figure 11:
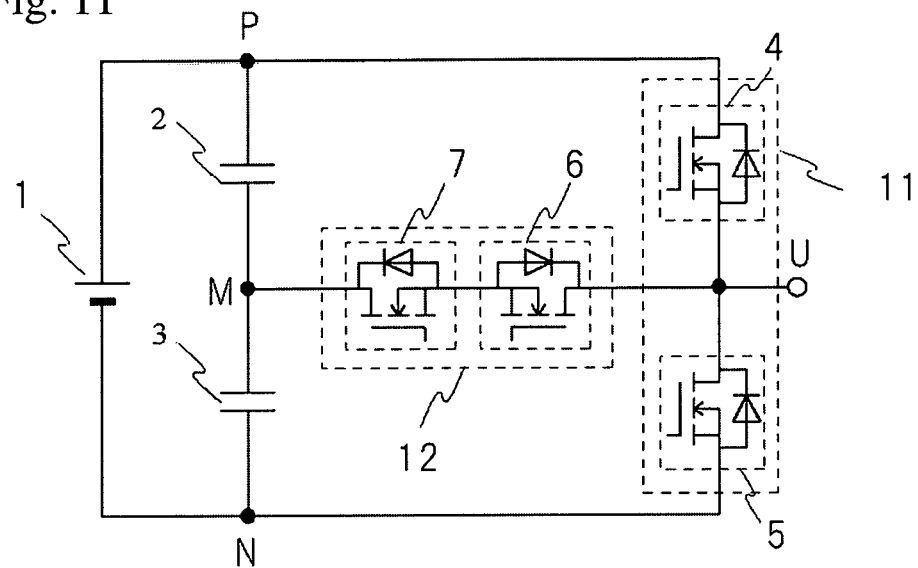
FIG. 11 is a circuit configuration diagram showing a configuration of a single phase of a typical three-level inverter.
Figure 12A:
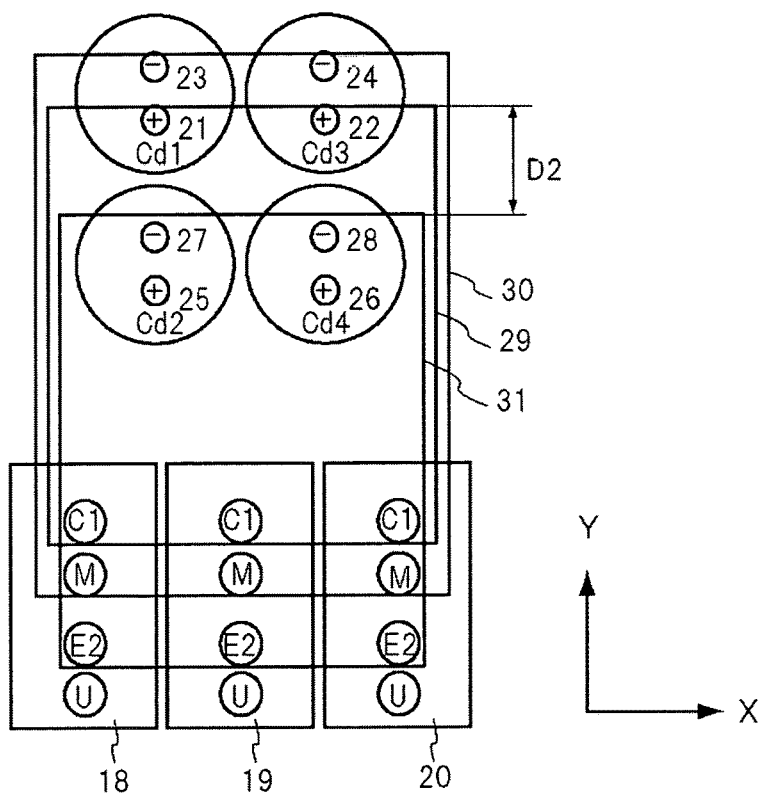
FIG. 12(a) is a plan view of a wiring structure of a conventional three-level inverter.
Figure 12B:
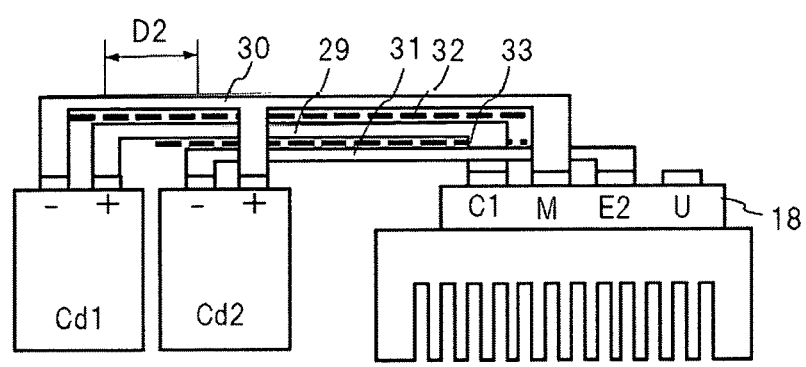
FIG. 12(b) is a side view thereof.

FIG. 10 shows a third embodiment of the present invention. In this example, the module housing the vertical arm and the module housing the intermediate arm are connected in three pairs in parallel. FIG. 10 shows a simplified configuration of a connecting terminal board assembly without the insulating plates of the foregoing connecting terminal board assembly, as with the second embodiment.

As shown in FIG. 10, three modules 20-1, 20-2, 20-3 each housing a vertical arm and three modules 30-1, 30-2, 30-3 each housing an intermediate arm are arranged alternately and in parallel.

These three pairs of modules that are disposed in parallel are provided with the connecting terminal boards 44B, 46B and 48B and a gate circuit board 50B, which are disposed across the six modules 20-1, 20-2, 20-3, 30-1, 30-2, and 30-3.

The high-potential connecting terminal board 48B is provided with three terminal connectors (48a-1, 48a-2, 48a-3) that are connected to the connecting terminals of the modules 20-1, 20-2 and 20-3 each housing a vertical arm, and three external connecting ends (48b-1, 48b-2, 48b-3) that are connected to the capacitors and the like.

The low-potential connecting terminal board 44B is provided with three terminal connectors (not shown) that are connected to the connecting terminals of the modules 20-1, 20-2 and 20-3 each housing a vertical arm, and three external connecting ends (44b-1, 44b-2, 44b-3) that are connected to the capacitors and the like.

The intermediate-potential connecting terminal board 46B is provided with three terminal connectors (46a-1, 46a-2, 46a-3) that are connected to the connecting terminals of the modules 30-1, 30-2 and 30-3 each having an intermediate arm, and three external connecting ends (46b-1, 46b-2, 46b-3) that are connected to the capacitors and the like.

The capacitors are not shown in the diagram but are connected between the external connecting ends 48b-1 and 46b-1 at the upper portions of the connecting terminal boards, between the external connecting ends 44b-1 and 46b-1, between the external connecting ends 48b-2 and 46b-2, between the external connecting ends 44b-2 and 46b-2, between the external connecting ends 48b-3 and 46b-3, and between the external connecting ends 44b-3 and 46b-3, and disposed in the upper portions of the modules.

The terminal connectors and the external connecting ends of the respective connecting terminal boards are located diagonally to each other in the respective pairs of modules. For instance, in the connecting terminal board 48B, the terminal connector 48a-1 is positioned immediately above the module 20-1, and the external connecting end 48b-1 is positioned immediately above the module 30-1 paired with the module 20-1. Another terminal connector 48a-2 is positioned immediately above the module 20-2, and the external connecting end 48b-2 is positioned immediately above the module 30-2 paired with the module 20-2. The terminal connector 48a-3 is positioned immediately above the module 20-3, and the external connecting end 48b-3 is positioned immediately above the module 30-3 paired with the module 20-3.

Therefore, in the third embodiment as well, the magnetic fluxes of the currents flowing oppositely between these connecting terminal boards offset each other, resulting in a reduction in wiring inductances of the connecting terminal boards. Positioning the terminal connectors and external connecting ends of the connecting terminal boards diagonally to each other in the terminal boards can further reduce the wiring inductances of the connecting terminal boards as with the first embodiment and the second embodiment.

Since the present invention can further reduce the wiring inductances of the DC circulating current paths in the three-level inverter as described above, the occurrence of a surge voltage can be prevented even when using a high-speed semiconductor switch in which semiconductor switches of a module housing a vertical arm are configured with wide band-gap (WBG) semiconductors such as SiC. Therefore, the performance and safety of the three-level inverter can further be improved.

REFERENCE SIGNS LIST 20, 20-1, 20-2, 20-3 Module that houses vertical arm
30, 30-1, 30-2, 30-3 Module that houses intermediate arm
40 Connecting terminal board assembly
41 Connecting terminal board functioning as output connection conductor
41a Terminal connector
42, 43, 45, 47, 49 Insulating plate
44 Connecting terminal board functioning as low-potential connection conductor
44a, 44a-1, 44a-2, 44a-3 Terminal connector
44b, 44b-1, 44b-2, 44b-3 External connecting end
46 Connecting terminal board functioning as intermediate-potential connection conductor
46a, 46a-1, 46a-2, 46a-3 Terminal connector
46b, 46b-1, 46b-2, 46b-3 External connecting end
48 Connecting terminal board functioning as high-potential connection conductor
48a, 48a-1, 48a-2, 48a-3 Terminal connector
48b, 48b-1, 48b-2, 48b-3 External connecting end
50 Gate circuit board

What is claimed is:

1. A three-level power converter, comprising:
   a first module housing a vertical arm forming a three-level power conversion circuit and having connecting terminals extending in a first direction from an upper surface thereof;
   a second module disposed adjacent to the first module along a second direction being perpendicular to the first direction and housing an intermediate arm forming the three-level power conversion circuit, the second module having connecting terminals extending in the first direction from an upper surface thereof;
   a flat high-potential connecting terminal board having
      a lower end connected to one of the connecting terminals on the upper surface of the first module,
      an upper end provided with a first external connecting end above the second module, and
      a main body extending along the first direction to connect the lower end and the upper end of the high-potential connecting terminal board, and facing a third direction being perpendicular to the first and second directions;
   a flat low-potential connecting terminal board having
      a lower end connected to another of the connecting terminals on the upper surface of the first module,
      an upper end provided with a second external connecting end above the second module, and
      a main body extending along the first direction to connect the lower end and the upper end of the low-potential connecting terminal board, and arranged parallel to the main body of the high-potential connecting terminal board; and
   a flat intermediate-potential connecting terminal board having
      a lower end connected to one of the connecting terminals on the upper surface of the second module,
      an upper end provided with a third external connecting end above the first module, and
      a main body extending along the first direction to connect the lower end and the upper end of the intermediate-potential connecting terminal board, and arranged parallel to and between the main body of the high potential connecting terminal board and the main body of the low-potential connecting terminal board; and
   a DC capacitor having terminals connected to the first external connecting end, the second external connecting end, and the third external connecting end, respectively,
   wherein the high-potential connecting terminal board, the low-potential connecting terminal board, and the intermediate-potential connecting terminal board have lateral widths covering the first and second modules, and
   each of the main bodies of the high-potential connecting terminal board, the low-potential connecting terminal board, and the intermediate-potential connecting terminal board is disposed between the connecting terminals of the first and second modules without overlapping the connecting terminals of the first and second modules in the first direction.

2. The three-level power converter according to claim 1, wherein the connecting terminals on the upper surfaces of the first module and the second module are pin-shaped terminals, and the connecting terminals on the upper surface of the first module are arranged same as that on the upper surface of the second module.

3. The three-level power converter according to claim 1, wherein the connecting terminals of the first module includes
   a high-potential connecting terminal connected to the lower end of the high-potential connecting terminal board, and
   a low-potential connecting terminal arranged adjacent to the high-potential connecting terminal in the third direction and connected to the lower end of the low-potential connecting terminal board, and the connecting terminals of the second module includes an intermediate-potential connecting terminal connected to the lower end of the intermediate-potential connecting terminal board.

4. The three-level power converter according to claim 3, further comprising:

a first insulating plate arranged between the main body of the low-potential connecting terminal board and the main body of the intermediate-potential connecting terminal board, and a second insulating plate arranged between the main body of the intermediate-potential connecting terminal board and the main body of the high-potential connecting terminal board.

5. The three-level power converter according to claim 1, wherein the high-potential connecting terminal board further includes a first terminal connector connected to the one of the connecting terminals on the upper surface of the first module and positioned diagonally to the first external connecting end, the low-potential connecting terminal board further includes a second terminal connector connected to the another of the connecting terminals on the upper surface of the first module and positioned diagonally to the second external connecting end, and the intermediate-potential connecting terminal board further includes a third terminal connector connected to the one of the connecting terminals on the upper surface of the second module and positioned diagonally to the third external connecting end.

6. The three-level power converter according to claim 5, wherein the first terminal connector is disposed at one side of the main body of the high-potential connecting terminal board, and the first external connecting end is disposed at another side of the main body of the high-potential connecting terminal board opposite to the one side of the high-potential connecting terminal board in the second direction, the second terminal connector is disposed at one side of the main body of the low-potential connecting terminal board, and the second external connecting end is disposed at another side of the main body of the low-potential connecting terminal board opposite to the one side of the low-potential connecting terminal board in the second direction, and the third terminal connector is disposed at one side of the main body of the intermediate- potential connecting terminal board, and the third external connecting end is disposed at another side of the main body of the intermediate-potential connecting terminal board opposite to the one side of the intermediate-potential connecting terminal board in the second direction.

7. The three-level power converter according to claim 6, wherein the second terminal connector and the second external connecting end extend opposite to each other in the third direction.

8. The three-level power converter according to claim 7, wherein the DC capacitor is disposed in the first direction of the first and second modules.

9. The three-level power converter according to claim 1, wherein the first module and the second module include a plurality of first and second modules forming a pair, the plurality of module pairs is arranged in case of parallel arrangement such that the first modules and the second modules are disposed adjacent to each other alternately, the high-potential connecting terminal board, the low-potential connecting terminal board, and the intermediate-potential connecting terminal board are formed across entirety of the plurality of module pairs, and the plurality of module pairs is connected in parallel by the high-potential connecting terminal board, the low-potential connecting terminal board, and the intermediate-potential connecting terminal board.

10. The three-level power converter according to claim 1, wherein the first module further includes a semiconductor switching element formed from a wide band-gap semiconductor.

* * * * *

UNITED STATES PATENT AND TRADEMARK OFFICE
CERTIFICATE OF CORRECTION

PATENT NO. : 10,153,708 B2
APPLICATION NO. : 15/230968
DATED : December 11, 2018
INVENTOR(S) : Koji Maruyama et al.

Page 1 of 1

It is certified that error appears in the above-identified patent and that said Letters Patent is hereby corrected as shown below:

In the Specification

Please change Column 9, Line 38, from "… circuit board are" to --… circuit board 50 are--.

Signed and Sealed this
Twenty-sixth Day of February, 2019

Andrei Iancu
*Director of the United States Patent and Trademark Office*